United States Patent
Yokoyama

(10) Patent No.: US 6,307,351 B1
(45) Date of Patent: Oct. 23, 2001

(54) DEVICE AND METHOD FOR DETERMINING STATE OF CHARGE

(75) Inventor: Hidenori Yokoyama, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 09/708,719

(22) Filed: Nov. 9, 2000

(30) Foreign Application Priority Data

Nov. 9, 1999 (JP) .................................................. 11-318312

(51) Int. Cl.[7] .......................... H01M 10/44; H01M 10/46
(52) U.S. Cl. ........................................... 320/132; 324/426
(58) Field of Search ................................... 320/132, 149, 320/DIG. 19, DIG. 21; 324/426, 431, 433; 340/635, 636; 429/90

(56) References Cited

U.S. PATENT DOCUMENTS 5,321,627 * 6/1994 Reher .................................... 340/636
5,411,537 * 5/1995 Munshi et al. ........................ 607/33

FOREIGN PATENT DOCUMENTS

| 02-193533 | 7/1990 | (JP) . |
| 04-372536 | 12/1992 | (JP) . |
| 05-134020 | 5/1993 | (JP) . |

* cited by examiner

Primary Examiner—Edward H. Tso
(74) Attorney, Agent, or Firm—Kenyon & Kenyon

(57) ABSTRACT

A device for determining a state of charge of a battery with high precision regardless of deterioration of the battery. After fully charging the battery, the device sets the battery to an arbitrary state of charge. The device then detects the charging voltage and the charging current occurring at that time. Based on the detected charging voltage and the detected charging current, the device corrects a pre-stored relationship among the charging voltage, the charging current, and the state of charge. After that, based on the corrected relationship, the device determines a state of charge of the battery.

12 Claims, 4 Drawing Sheets

DEVICE AND METHOD FOR DETERMINING STATE OF CHARGE

INCORPORATION BY REFERENCE

The disclosure of Japanese Patent Application No. HEI 11-318312 filed on Nov. 9, 1999 including the specification, drawings and abstract is incorporated herein by reference in its entirety.

BACKGROUND OF THE INVENTION

1. Field of the Invention

The invention relates to a device and a method for determining a state of charge of a battery and, more particularly, to a device and a method for determining a state of charge of a battery based on changing voltage and charging current.

2. Description of the Related Art

An art for determining a state of charge of a battery based on charging voltage and charging current is known.

For example, Japanese Patent Application Laid-Open No. HEI 4-372536 discloses an art in which a battery is charged with (1) a voltage lower than an appropriate charging voltage, (2) the appropriate voltage, and (3) a voltage higher than the appropriate voltage, and a state of charge of the battery is determined by comparing the charging currents corresponding to the charging voltages (1) to (3) with the value of current produced when the battery is normal and in a charge-completed state.

In general, the charging voltage, the charging current, and the state of charge of a battery have a predetermined relationship (charging characteristic). Such a charging characteristic is used by the above-described relevant art to determine a state of charge of a battery. However, as a result of repeated charge/discharge cycles or deterioration over time, the charge characteristic (i.e., the relationship among the charging voltage, the charging current, and the state of charge) changes. Therefore, if a predetermined charging characteristic is used as a basis for determining the state of charge, high-precision determination regarding the state of charge is difficult.

SUMMARY OF THE INVENTION

Accordingly, it is an object of the invention to provide a device capable of always determining a state of charge of a battery with a high precision regardless of repeated charge/discharge cycles and deterioration of the battery over time.

A device for determining state of charge according to one aspect of the invention includes a memory device that stores a relationship among a charging voltage, a charging current and a state of charge of a battery. The device also includes a controller that controls the state of charge, a detector that detects a charging voltage and a charging current at a predetermined state of charge obtained by discharging the battery from a fully charged state. The device also includes a changing device that changes the relationship stored in the memory based on the detected charging voltage and the charging current.

Therefore, high-precision determination regarding the state of charge of a battery is possible, regardless of the state of deterioration of the battery.

BRIEF DESCRIPTION OF THE DRAWINGS

The foregoing and further objects, features and advantages of the invention will become apparent from the following description of a preferred embodiment with reference to the accompanying drawings, wherein like numerals are used to represent like elements and wherein.

DETAILED DESCRIPTION OF PREFERRED EMBODIMENT

A preferred embodiment of the invention will be described hereinafter with reference to the accompanying drawings, in conjunction with a vehicle-installed battery.

Figure 1:
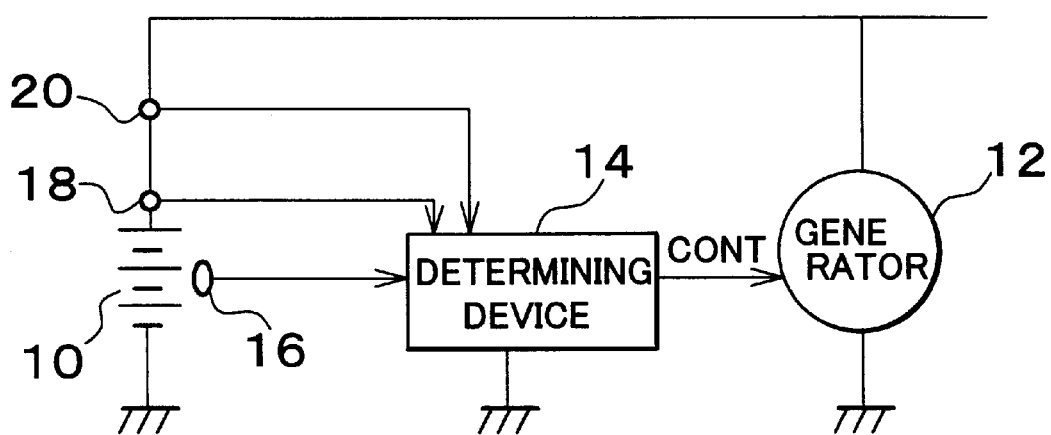
FIG. 1 is a diagram illustrating a circuit construction of an embodiment of the invention.

FIG. 1 shows a circuit construction of the embodiment. battery 10 is connected to a power generator 12 (e.g., an alternator of a vehicle). Although not shown, a load, such as a motor/generator (M/G) or the like, is connected to the battery 10, and is driven in accordance with needs.

A determining device 14 connected to the battery 10 determines whether the battery 10 has a quantity of electricity remaining sufficient to drive the load. If the quantity of electricity remaining of the battery 10 is not sufficient, the determining device 14 outputs a control signal CONT to the power generator 12 to operate the power generator 12, thereby charging the battery 10. It is preferred that the charging voltage of the battery 10 be set in accordance with the temperature of the battery 10 detected by a temperature sensor 16.

The state of charge of the battery 10 can be determined by the determining device 14 based on the charging voltage and the charging current of the battery 10. That is, a charging characteristic (relationship among the charging voltage, the charging current, and the state of charge (SOC)) is pre-stored. The charging voltage and the charging current at the time of charging are detected by a voltage sensor 18 and a current sensor 20, respectively. Based on the detected charging voltage, the detected charging current and the pre-stored charging characteristic, a state of charge of the battery 10 can be determined.

However, when the battery 10 deteriorates after repeated charge/discharge cycles, the actual charging characteristic becomes different from the pre-stored charging characteristic, so that precise determination of a state of charge becomes impossible.

Therefore, the determining device 14 in this embodiment corrects the pre-stored charging characteristic at a predetermined timing, and determines a state of charge of the battery 10 based on the corrected charging characteristic.

Figure 2:
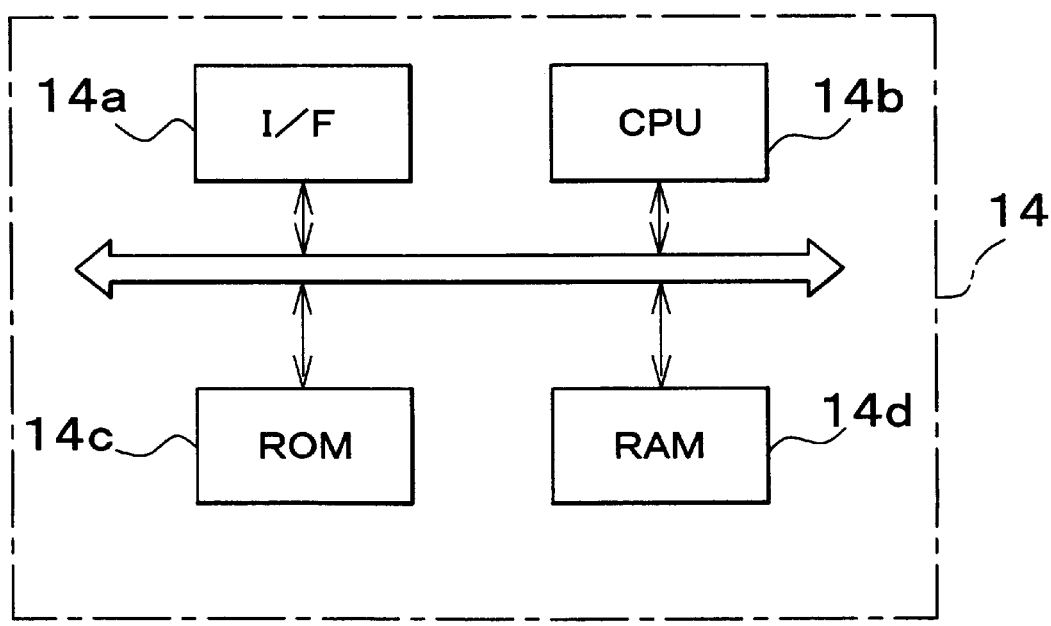
FIG. 2 is a block diagram illustrating a construction of a determining device shown in FIG. 1.

FIG. 2 is a block diagram illustrating a construction of the determining device 14 shown in FIG. 1. The determining device 14 includes an interface (I/F) 14a for transmitting signals to and receiving signals from an external device, and further includes a CPU 14b, a ROM 14c, and a RAM 14d. These components are interconnected by a common data bus.

The ROM 14c stores a predetermined charging characteristic of the battery 10. The CPU 14b determines a state of charge of the battery 10 based on a detected charging voltage and a detected charging current of the battery 10 by referring to the charging characteristic stored in the ROM 14c.

Figure 3:
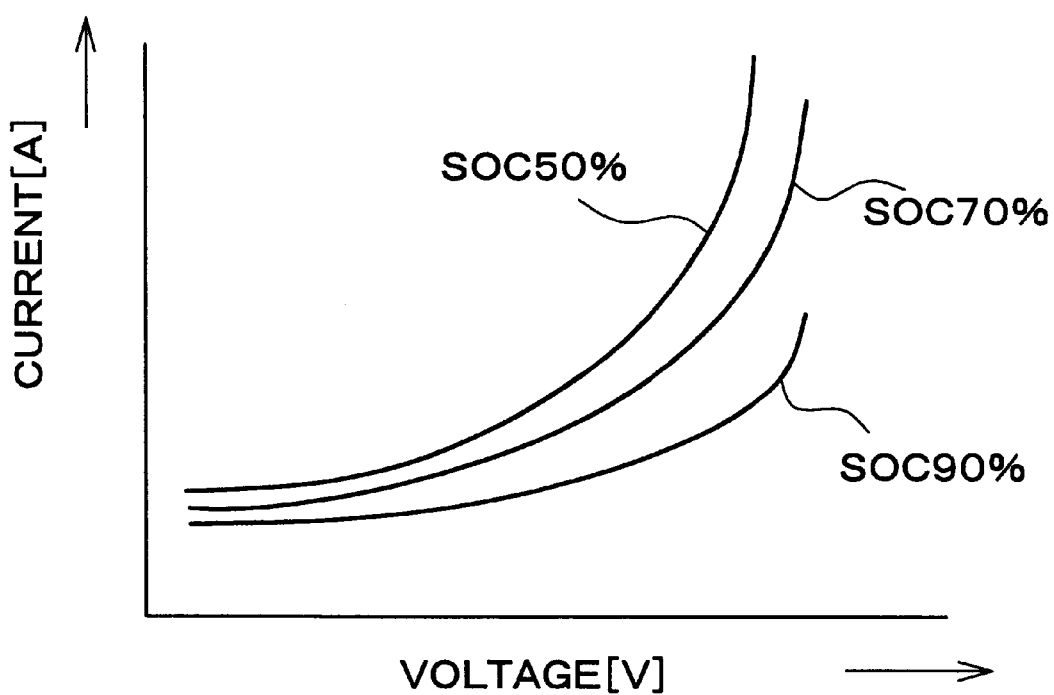
FIG. 3 is a graph indicating a relationship among the charging voltage, the charging current, and the state of charge.

FIG. 3 is a graph indicating charging characteristics stored in the ROM 14c. In the graph, the horizontal axis indicates the charging voltage (V), and the vertical axis indicates the charging current (A). The graph indicates charging characteristics using the state of charge (SOC) as a parameter (for the sake of a simple illustration, only the charging characteristics of SOC=50%, 70%, and 90% are indicated). If the charging voltage remains unchanged, the charging current decreases with increases in the level of the state of charge. When SOC=100% (that is, during a fully charged state), the charging current assumes a constant small value. Therefore, if such relationships with respect to a plurality of states of charge are stored in the form of a map, it becomes possible to determine a single state of charge of the battery 10 based on a detected charging voltage and a detected charging current.

The RAM 14d stores correction factors for correcting the charging characteristics stored in the ROM 14c. Each correction factor is calculated by the CPU 14b through a process described below, and is stored in the RAM 14d. Using the correction factors, the CPU 14b corrects the relationships stored in the ROM 14c. Based on the corrected relationships, the CPU 14b determines the present state of charge of the battery 10. The correction factors stored in the RAM 14d are initially set to "1" (that is, no correction). The CPU 14b updates the correction factors as follows. That is, the CPU 14b calculates a new correction factor at a predetermined timing, and stores the new correction factor into the RAM 14d. Due to the update of the correction factors, the state of charge can be determined with high precision regardless of changes of the battery 10 over time.

Figure 4:
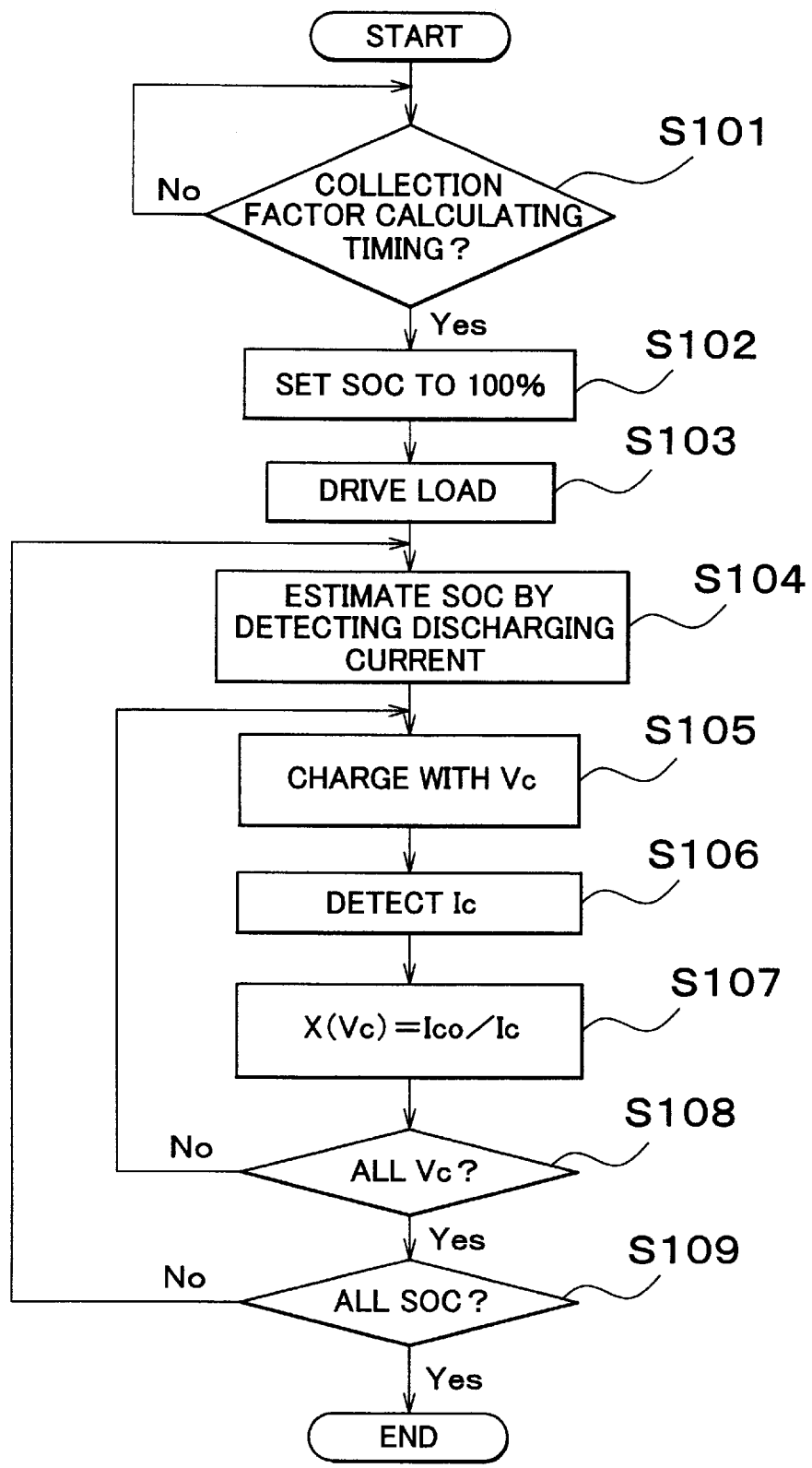
FIG. 4 is a flowchart of a correcting process in the invention.

FIG. 4 shows a flowchart of a correcting process performed by the determining device 14 in this embodiment. First, the CPU 14b determines whether it is time to perform a calculation to establish the correction factors stored in the RAM 14d (S101). This determination can be made based on whether the battery 10 has deteriorated to such a level that the pre-stored charging characteristics of the battery 10 are not maintained (more specifically, whether the quantity of charged/discharged electricity of the battery 10 has exceeded a predetermined value). The quantity of charged/discharged electricity may be indirectly evaluated by counting the number of charge/discharge cycles and determining whether the count exceeds a predetermined number, or by determining whether the number of times of operating the load has exceeded a predetermined number.

When the correction factor calculating timing is reached, the CPU 14b subsequently outputs the control signal CONT to the power generator 12 so as to fully charge the battery 10 (SOC=100%) (S102). The reason for temporarily fully charging the battery 10 is that if discharge is started in the fully charged state, the state of charge of the battery 10 can be estimated with good precision by detecting the charging current. Whether the battery 10 is fully charged or not can be determined by determining whether the charging current has reached a constant small current value based on detection by the current sensor 20.

After setting the battery 10 to the fully charged state, the CPU 14b drives the load (e.g., a motor/generator (M/G)) connected to the battery 10 (S103). Subsequently, the CPU 14b detects the discharging current through the use of the current sensor 20 while driving the load, and estimates the state of charge of the battery 10 (S104). More specifically, the CPU 14b detects the discharging current while driving the M/G, and integrates the value of current to determine a power W [A·h], and subtracts the calculated power from the power of the battery 10 (full charged state), thereby estimating a state of charge. It is also preferred that a relationship between the discharging current and the state of charge (SOC) be stored as a map, and a state of charge (SOC) be estimated based on the detected discharging current by referring to the map.

After estimating the present state of charge (SOC) as a result of discharge from the fully charged state, the CPU 14b outputs the control signal CONT to the power generator 12 to set the charging voltage to Vc and charge the battery 10 with the charging voltage Vc (S105). Then, the charging current Ic at the time of the charging operation with the charging voltage Vc is detected by the current sensor 20 (S106). Using the charging voltage Vc and the charging current Ic, the CPU 14b calculates a correction factor (S107). The present state of charge has been estimated by the processing of S104, and the charging voltage Vc and the charging current Ic have been obtained through the processings of S105 and S106. Therefore, after reading a value of the charging current Ico in the initial state of charge from the map stored in the ROM 14c, the CPU 14b is able to calculate a correction factor $\alpha(Vc)(\alpha(Vc)=Ico/Ic)$.

After calculating the correction factor $\alpha(Vc)$ with respect to the aforementioned charging voltage Vc, the CPU 14b determines whether correction factors have been calculated with respect to all the necessary values of the charging voltage (S108). The optimal charging voltage of the battery 10 varies depending on the temperature of the battery 10. Therefore, in order to allow precise determination of the state of charge at many values of the charging voltage, it is necessary to calculate correction factors with respect to a plurality of values of the charging voltage. Therefore, when correction factors have not been calculated with respect to all the necessary values of the charging voltage, the CPU 14b returns to the processing of S105, in which the CPU 14b sets a new charging voltage. Subsequently, in S106 and S107, the CPU 14b calculates a correction factor $\alpha(Vc)$ with respect to the new charging voltage.

After calculating correction factors with respect to all the necessary values of the charging voltage (YES in S108), the CPU 14b determines whether correction factors have been calculated with respect to all the states of charge (e.g., at intervals of 10%, as in SOC=10%, 20%, 30%, . . . , 90%)(S109). A greater number of values of the state of charge (smaller data interval) allows higher precision of determination regarding the state of charge. By repeating the process of S104 to S109, the CPU 14b calculates correction factors $\alpha(Vc)$ with respect to all the predetermined states of charge.

After calculating the correction factors $\alpha(Vc)$, the CPU 14b updates the correction factors stored in the RAM 14d. After that, if it becomes necessary to determine a state of charge of the battery 10, the CPU 14b uses updated correction factors to correct the relationships stored in the ROM 14c. More specifically, after the elapse of a predetermined time (e.g., 10 seconds) following a start of the engine, a battery charging current is detected by the current sensor 20. The CPU 14b corrects the detected charging current by multiplying it by a correction factor $\alpha(Vc)$ stored in the RAM 14d. Using the corrected charging current and the map stored in the ROM 14c, the CPU 14b determines the state of charge at that time.

Figure 5:
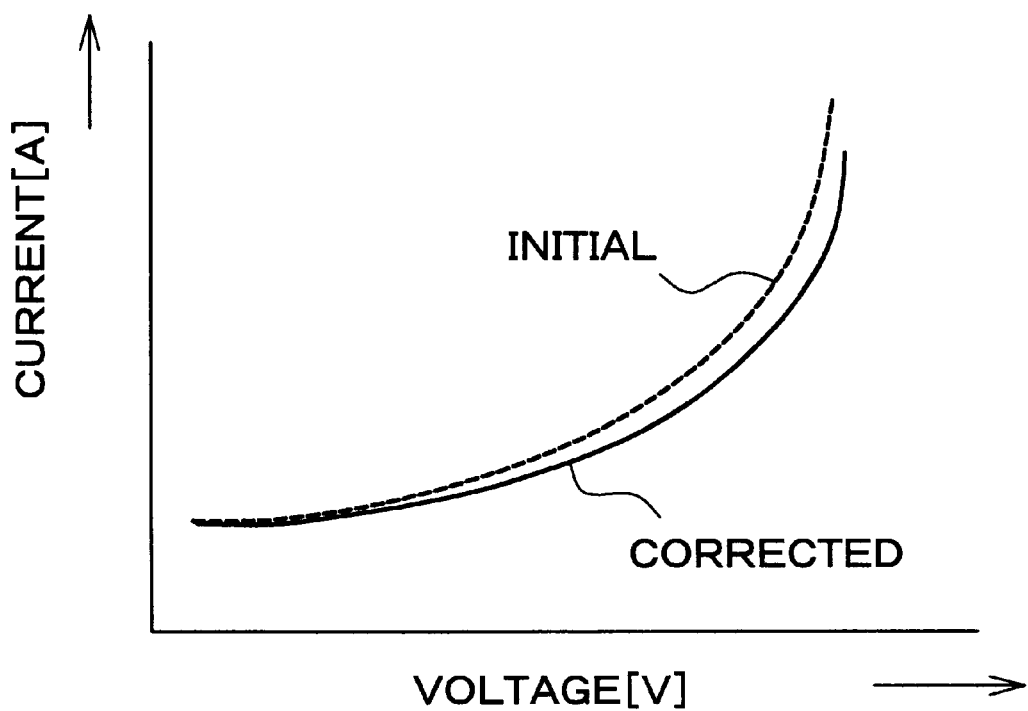
FIG. 5 is a graph indicating the state of charge after correction.

FIG. 5 indicates an example in which a charging characteristic is corrected (SOC=70%). In the diagram, a broken line indicates a predetermined initial state of charge stored in the ROM 14c, and a solid line indicates a state of charge after the correction using a correction factor α(Vc). In general, as the battery 10 deteriorates, the value of charging current decreases even if the state of charge remains the same. As described above, the use of a corrected charging characteristic makes it possible to determine the state of charge of the battery 10 with high precision even if the battery 10 deteriorates.

Although in this embodiment, correction factors α(Vc) are calculated with respect to a plurality of charging voltages and a plurality of states of charge, it is also possible to determine values between the values of charging voltage used for calculation, or values between the values of charging current used for calculation, for example, based on linear interpolation.

Furthermore, if the ROM 14c is a rewritable memory (e.g., EEPROM), the map stored in the ROM 14c can also be updated. That is, the charging characteristics can be updated using the values of charging voltage and charging current detected with respect to a plurality of states of charge in the process of S104 to S106.

As understood from the foregoing description, the invention makes it possible to determine the state of charge of a battery with high precision even if the battery deteriorates after it has been repeatedly charged and discharged. Therefore, the load connected to the battery can be driven and controlled with high precision, and the battery can be appropriately charged.

While the invention has been described with reference to what is presently considered to be a preferred embodiment thereof, it is to be understood that the invention is not limited to the disclosed embodiments or constructions. On the contrary, the invention is intended to cover various modifications and equivalent arrangements.

What is claimed is:

1. A device for determining a state of charge of a battery comprising:
   a memory device that stores a relationship among a charging voltage, a charging current, and the state of charge;
   a controller that controls the state of charge;
   a detector that detects a charging voltage and a charging current at a predetermined state of charge obtained by discharging the battery from a fully charged state; and
   a changing device that changes the relationship stored in the memory device based on the detected charging voltage and the detected charging current.

2. A device according to claim 1, wherein
   the controller discharges the battery to a plurality of states of charge.

3. A device according to claim 2, wherein
   the detector detects the charging voltage and the charging current at each state of the plurality of the states of charge.

4. A device according to claim 1 further comprising:
   a determining device that determines a quantity of charged and discharged electricity of the battery, wherein
   the changing device changes the relationship stored in the memory device when the determined quantity exceeds a predetermined value.

5. A device for determining a state of charge of a battery comprising:
   means for storing a relationship among a charging voltage, a charging current, and the state of charge;
   means for controlling the state of charge;
   means for detecting a charging voltage and a charging current at a predetermined state of charge obtained by discharging the battery from a fully charged state; and
   means for changing the relationship stored in the means for storing a relationship among a charging voltage, a charging current, and the state of charge, based on the detected charging voltage and the detected charging current.

6. A device according to claim 5, wherein
   the means for controlling the state of charge discharges the battery to a plurality of states of charge.

7. A device according to claim 6, wherein
   the means for detecting a charging voltage and a charging current detects the charging voltage and the charging current at each state of the plurality of the states of charge.

8. A device according to claim 5 further comprising:
   means for determining a quantity of charged and discharged electricity of the battery, wherein
   the changing device changes the relationship stored in the means for means for storing a relationship among a charging voltage, a charging current, and the state of charge, when the determined quantity exceeds a predetermined value.

9. A method for determining a state of charge of a battery comprising:
   storing a relationship among a charging voltage, a charging current, and the state of charge;
   charging a battery to a fully charged state;
   discharging the battery to a predetermined state of charge from the fully charged state;
   detecting at least one charging voltage and one charging current at the predetermined state; and
   changing the relationship based on the detected charging voltage and the detected charging current.

10. A method according to claim 9, wherein
    the predetermined state includes a plurality of states of charge.

11. A method according to claim 10, wherein
    the charging voltage and the charging current are detected at each state of the plurality of the states of charge.

12. A method according to claim 9 further comprising:
    determining a quantity of charged and discharged electricity of the battery; and
    changing the stored relationship stored when the determined quantity exceeds a predetermined value.

* * * * *